United States Patent
Ramirez et al.

(10) Patent No.: US 6,188,130 B1
(45) Date of Patent: Feb. 13, 2001

(54) EXPOSED HEAT SPREADER WITH SEAL RING

(75) Inventors: German Ramirez, Antioch; Serafin Padilla Pedron, Jr., Manteca, both of CA (US)

(73) Assignee: Advanced Technology Interconnect Incorporated, Manteca, CA (US)

(*) Notice: Under 35 U.S.C. 154(b), the term of this patent shall be extended for 0 days.

(21) Appl. No.: 09/332,306

(22) Filed: Jun. 14, 1999

(51) Int. Cl.[7] .................................................. H01L 23/10
(52) U.S. Cl. ........................ 257/706; 227/684; 227/796; 227/713; 227/675; 227/676
(58) Field of Search .................................. 257/675, 706, 257/707, 712, 713, 717, 720, 666, 796, 784, 676

(56) References Cited

U.S. PATENT DOCUMENTS

| 4,707,724 | | 11/1987 | Suzuki et al. ........................ 357/71 |
| 4,965,699 | * | 10/1990 | Jorden et al. ........................ 361/387 |
| 5,015,803 | | 5/1991 | Mahulikar et al. ................. 174/52.4 |
| 5,198,693 | * | 3/1993 | Imken et al. ........................ 257/720 |
| 5,367,196 | | 11/1994 | Mahulikar et al. .................. 257/787 |
| 5,455,457 | * | 10/1995 | Kurokawa ............................ 257/712 |
| 5,530,295 | | 6/1996 | Mehr .................................... 257/796 |
| 5,574,314 | * | 11/1996 | Okada et al. ........................ 257/728 |
| 5,578,869 | * | 11/1996 | Hoffman et al. ..................... 257/691 |
| 5,608,267 | | 3/1997 | Mahulikar et al. .................. 257/796 |
| 5,641,987 | | 6/1997 | Lee ...................................... 257/675 |
| 5,652,461 | | 7/1997 | Ootsuki et al. ...................... 257/675 |
| 5,656,864 | | 8/1997 | Mitsue et al. ........................ 257/787 |
| 5,744,863 | * | 4/1998 | Culnane et al. ..................... 257/712 |
| 5,757,070 | | 5/1998 | Fritz .................................... 257/675 |
| 5,793,613 | | 8/1998 | Poinelli et al. ...................... 361/723 |
| 5,814,877 | * | 9/1998 | Diffenderfer et al. ............... 257/666 |
| 5,814,878 | | 9/1998 | Hirakawa et al. ................... 257/667 |
| 5,847,927 | * | 12/1998 | Minning et al. ..................... 361/496 |
| 5,854,511 | * | 12/1998 | Shin et al. ........................... 257/713 |
| 5,859,477 | | 1/1999 | Fehr .................................... 257/796 |
| 5,892,278 | * | 4/1999 | Hurita et al. ........................ 257/706 |

\* cited by examiner

*Primary Examiner*—Alexander O. Williams
(74) *Attorney, Agent, or Firm*—Wiggin & Dana; William A. Simons

(57) ABSTRACT

A semiconductor package comprising: (a) at least one semiconductor device; (b) a metal heat spreader that has at least one surface exposed to ambient and the perimeter of that exposed surface having a seal ring border; (c) a leadframe having a plurality of inner and outer leads, said inner leads interconnected to said semiconductor device; and (d) a molding resin encapsulating said semiconductor device, said inner leads of said leadframe and all of the heat spreader except that exposed surface having the seal ring border.

8 Claims, 3 Drawing Sheets

EXPOSED HEAT SPREADER WITH SEAL RING

BACKGROUND OF THE INVENTION

1. Field of the Invention

The patent invention relates to a molded plastic package for a semiconductor device that includes a metal heat spreader having an exposed surface. The heat spreader has a raised seal ring around the periphery of that exposed surface that prevents plastic molding compound from bleeding over the exposed surface of the heat spreader during the encapsulation process.

2. Brief Description of the Art

Molded plastic electronic packages provide environmental protection to integrated circuit devices. Packages such as the QFP (quad flat package) and PLCC (plastic-leaded chip carrier) protect an encapsulated device from contaminants such as moisture as well as from mechanical shock. One molded plastic package is illustrated in U.S. Pat. No. 4,707,724 to Suzuki et al. The package has a leadframe with a centrally positioned die attach pad. The semiconductor device is bonded to the pad and electrically interconnected to the inner ends of the leadframe. A polymer molding resin encapsulates the device, die attach pad and inner lead ends.

One disadvantage with molded plastic packages is poor thermal dissipation. During operation, the semiconductor device generates heat which must be removed to maintain the operating integrity of the device. While some heat is dissipated through the bonding wires and leadframe, the remainder is absorbed into the molding resin. The molding resin is a poor thermal conductor so the device temperature will increase unless the power provided to the device is limited.

Incorporating a heat spreader into the molded plastic package provides an enhanced path for thermal dissipation. As a result, more power may be provided to the semiconductor device without a resultant excessive increase in device temperature. The heat spreader, which is usually copper or aluminum, is embedded in the molding resin, usually below the die attach pad, reducing the amount of molding resin through which heat must pass to reach a surface of the package.

In addition to copper or aluminum, heat spreaders formed from composites having a copper or aluminum component and a lower coefficient of thermal expansion component are disclosed in U.S. Pat. No. 5,015,803 to Mahulikar et al.

Various other improvements to heat spreaders have been made. For example, U.S. Pat. No. 5,367,196 to Mahulikar et al. teaches the use of an adhesion enhancing layer on an aluminum heat spreader. This adhesion enhancing layer may be anodized aluminum, chromium, zinc, a mixture of chromium and zinc or a mixture of chromium and phosphorous. This layer improves both thermal dissipation and adhesion to the molding resin.

U.S. Pat. No. 5,530,295 to Mehr discloses a nickel-plated copper or anodized aluminum heat spreader that has a pair of oblique steps that engage the dielectric housing of the electronic package and ensure the heat spreader does not become detached from the package. The heat spreader in this patent also contains a pair of alignment holes that are adapted to receive corresponding mold alignment pins.

U.S. Pat. No. 5,608,267 to Mahulikar et al. discloses a heat spreader made of aluminum, titanium, zinc, magnesium and alloys thereof and having an anodization layer coating thereon.

U.S. Pat. No. 5,641,987 to Lee discloses a heat spreader for a semiconductor package containing a plurality of rectangular openings broadening radically outwardly from a center pad. These openings are surrounded by regularly spaced indentations and alternating outwardly pointing and downwardly pointing projections.

U.S. Pat. No. 5,652,461 to Ootsuki et al. teaches the use of a convex heat spreader for a semiconductor device. The heat spreader is made from a high heat-conductive material such as copper, aluminum, silver, gold and alloys thereof.

U.S. Pat. No. 5,656,864 to Mitsue et al. discloses a semiconductor device having a two-part molded package and a supporting member made of anodized aluminum alloy plate that has through holes therein so that a molding resin flows during the molding of the package.

U.S. Pat. No. 5,814,878 to Hirakawa et al. is directed to heat-sink that has grooves formed in its internal top surface to suppress thermal resistance and to improve loss heating radiating efficiency.

U.S. Pat. No. 5,757,070 to Fritz teaches an integrated circuit package in which the lead fingers are spaced away from a copper heat spreader (or heat sink).

U.S. Pat. No. 5,793,613 to Poinelli et al. is directed to a molded plastic material package for a semiconductor electronic device that has a fully insulated inner heat sink material.

U.S. Pat. No. 5,859,477 to Fehr teaches a fully insulated heat-sink that has a side surface formed with a relief to allow flowable mold resin to pass thereby.

All of the above-noted U.S. Patents are incorporated herein by reference in their entireties.

One of the difficulties encountered during the encapsulation of molded plastic packages with a drop-in exposed heat spreader is the flashing or bleeding of the mold compound onto the exposed area of the heat spreader. This resin bleed problem is influenced by several factors; such as proper mold gating design, flow characteristics of the mold compound, molding parameters, thickness of the heat spreader, and flatness of the exposed area of the heat spreader. This latter factor of flatness is often difficult to achieve due to several inherent characteristics of heat spreader manufacturing processes, namely, the presence of burrs (unwanted metal protrusions left on the work piece as a result of mechanical operations) along the edges of the exposed area, surface imperfections, and/or foreign materials left on the exposed area of the heat spreader.

The presence of such an undesirable thin layer of plastic molding compound on the exposed area acts as an insulation to the heat spreader which could adversely affect the thermal performance of the semiconductor device. This resin bleed is also cosmetically unacceptable to a number of customers. Furthermore, this thin layer of resin sitting on top of the exposed heat spreader area has the potential of breaking off as loose particles which could create mechanical or electrical contact problems to electrical test handling systems. The present invention offers a solution to these problems caused by this thin layer of plastic molding compound on the heat spreader's exposed surfaces.

BRIEF SUMMARY OF THE INVENTION

Accordingly, one aspect of the present invention is directed to a metal heat spreader useful in an encapsulated semiconductor package having at least one surface that will be exposed after encapsulation of the package and having a raised seal ring around the perimeter of that surface.

Another aspect of the present invention is directed to an encapsulated semiconductor package, comprising;

(a) at least one semiconductor device;

(b) a metal heat spreader that has at least one surface exposed to ambient and the perimeter of that exposed surface having a raised seal ring border;

(c) a leadframe having a plurality of inner and outer leads, said inner leads interconnected to said semiconductor device; and (d) a molding resin encapsulating said semiconductor device, said inner leads of said leadframe and all of the heat spreader except that exposed surface having the seal ring border.

DETAILED DESCRIPTION OF THE PREFERRED EMBODIMENTS OF THE PRESENT INVENTION

Figure 1:
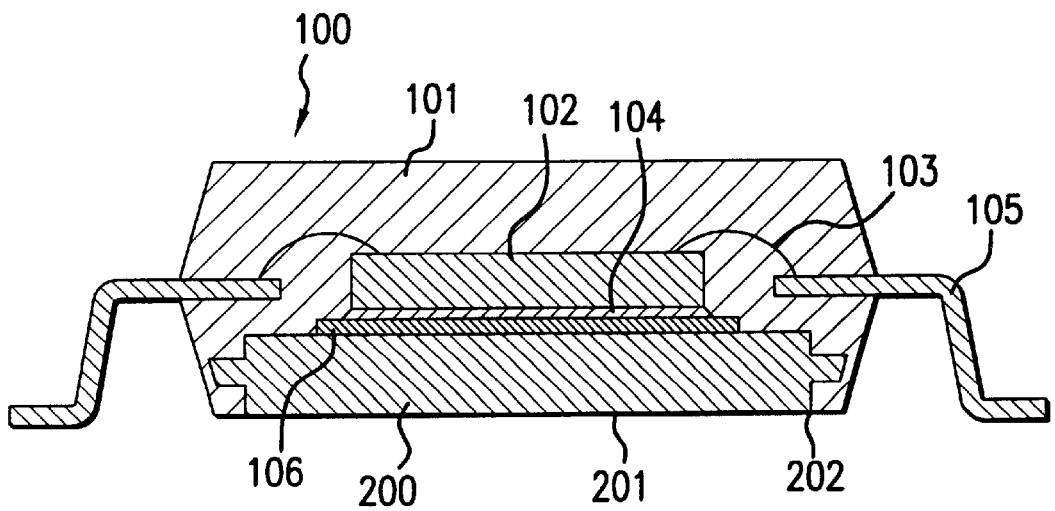
FIG. 1 shows in a cross-sectional representation a molded plastic package incorporating a heat spreader having an exposed surface as shown in the prior art.

FIG. 1 shows a prior art molded plastic QFP package 100 with an black-anodized aluminum exposed drop-in heat spreader 200 which is similar to those electronic packages described in U.S. Pat. No. 5,367,196 and 5,608,267 to Mahulikar et al. One such heat spreader is the DISSIPATER™, available from Advanced Interconnect Technologies, Inc. of Manteca, Calif. Package 100 includes a semiconductor chip 102 attached to leadframe die pad 106 using a polymer material 104, which is typically epoxy or silicone mixed with silver fillers to enhance both its thermal and electrical properties. Electrical connection from chip 102 may be made by a plurality of bond wires 103 to a plurality of bonding surfaces near the inside tips of leadframe 105, although other interconnection schemes such as tape automated bonding or flip clip may be utilized.

After wirebonding, the backside of leadframe pad 106 is then disposed either upon or adjacent to the inside surface of heat spreader 200 and the whole assembly encased in a molding compound 101, which is typically thermosetting epoxy or silicone material. During the molding process, mold compound 101 is subjected to high temperature (typically 175° C.) and pressure (typically between 800–1000 psig). At these temperature and pressure conditions, mold compound 101 turns into a low-viscosity fluid for several seconds until it sets. In this prior art embodiment, the exposed surface of heat spreader 200 meets the plastic molding material at 202. During the encapsulation process, some of the plastic molding material may bleed across line 202 to cover areas of the exposed surfaces 201 of the heat spreader 200.

Figure 2:
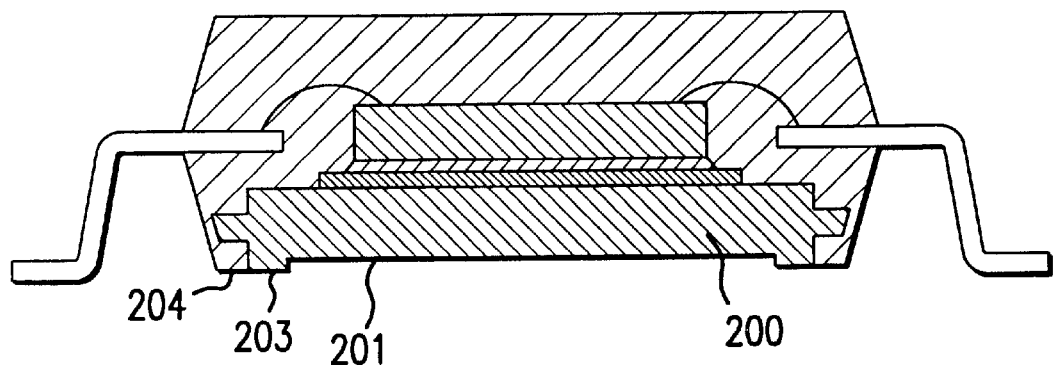
FIG. 2 shows in cross-sectional representation a molded plastic package incorporating a metal heat spreader in accordance with an embodiment of the invention.

FIG. 2 shows the embodiment of the present invention using the QFP package design similar to that of FIG. 1. This invention further includes a seal ring 203 around the edges of the exposed area 201 of heat spreader 200. Seal ring 203 is typically about 0.13 to 0.76 millimeters in width and about 0.0076 to about 0.033 millimeters in height. Preferably, the seal ring is about 0.05 millimeters in width and 0.02 millimeters in height. The seal ring is formed by coining an indentation in a work piece to produce a flat base surface and sidewalls which are perpendicular to the part base. By having the seal ring 203 be the area of contact between the mold surface 204 and surface 201 of heat spreader 200, it acts as a dam to prevent the mold compound from bleeding over the rest of the exposed area of the heat spreader during the encapsulation process.

The heat spreader of the present invention may be made of any metallic material ordinarily used for that purpose. This includes any of the metals taught in the U.S. patents discussed above. Copper and aluminum (and alloys thereof) heat spreaders are preferred and aluminum heat spreaders with an anodized surface are particularly preferred. Preferred aluminum alloys are those designated by the AAI (Aluminum Association, Inc.) in their publication, Aluminum Standards and Data, as 3xxx and 6xxx series.

Alloys of the 3xxx series contain up to about 1.5 percent by weight manganese, along with other alloying elements. The alloys are characterized by good thermal conductivity and about 20% higher strength than alloys designated as 1xxx series (greater than 99.00% aluminum).

Alloys of the 6xxx series contain up to about 0.15 percent by weight manganese, along with magnesium and silicon in an approximate proportion to form $Mg_2Si$. The alloys are characterized by good formability and good machinability. They are heat treatable land form a precipitation hardened alloy.

A most preferred aluminum alloy is aluminum alloy 6061, which has a nominal composition of about 0.30 percent by weight copper, about 0.15 percent by weight manganese and the balance aluminum. A black anodization layer may be formed by integral color anodization in an electrolyte containing a mixture of sulfuric and sulfosalicylic acids in a concentration range of from about 1–4 g/l $H_2SO_4$ and from about 50–120 g/l $C_7H_6O_6S$. The cell voltage is rapidly increased such that the current density increases from zero to over 7.53 $A/dm^2$ (70 ASF) within about 3 minutes. This anodization process is described in more detail in U.S. Pat. No. 5,066,368. The adhesion of the molding resin to the anodized heat spreader is further enhanced by mechanical locking. By proper control of the anodization parameters, pores of a desired size form in the anodization layer. A pore size of from about 50 to about 500 angstroms provides enhanced adhesion without weakening the strength of the layer. A preferred pore size is from about 75 to about 200 angstroms.

Figure 3:
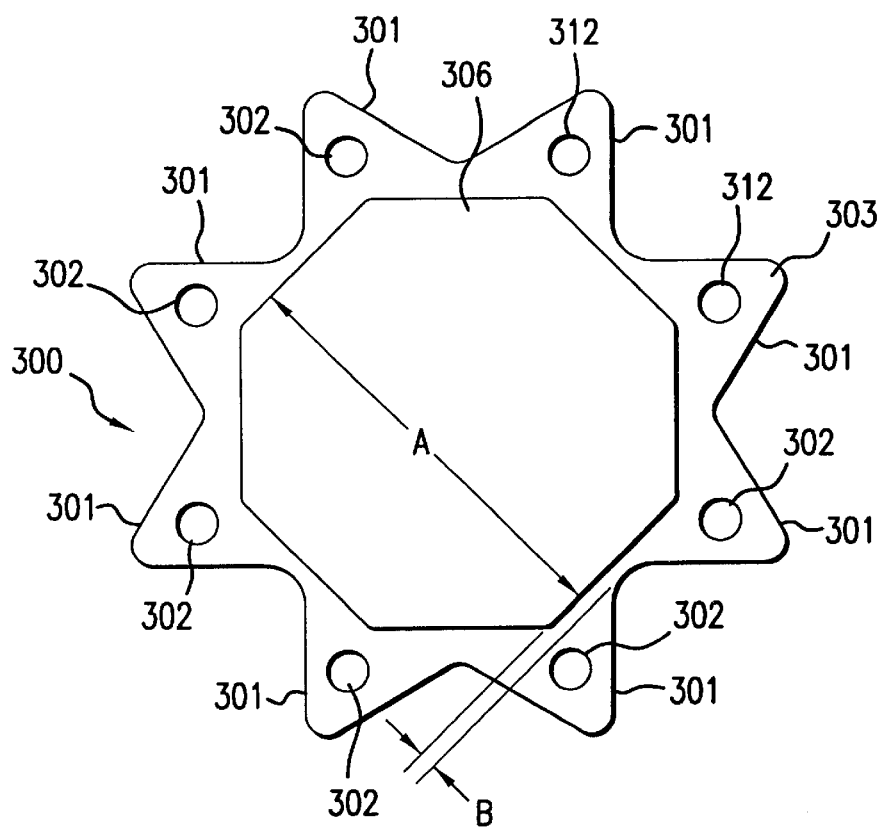
FIG. 3 shows a top view of another heat spreader of the present invention.
Figure 4:
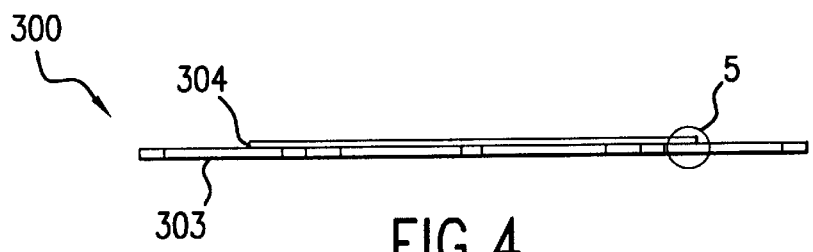
FIG. 4 shows a cross-sectional view of the heat spreader of FIG. 3.
Figure 5:
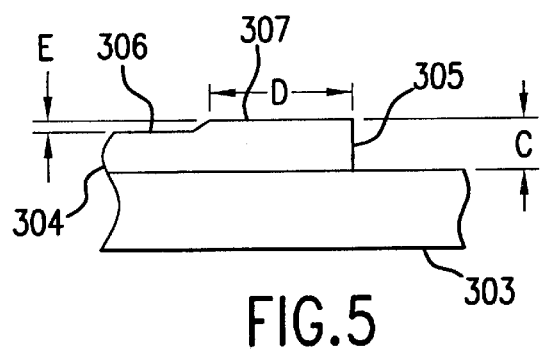
FIG. 5 shows an exploded view of portion 5 of FIG. 4 showing in detail the seal ring of the present invention.
Figure 6:
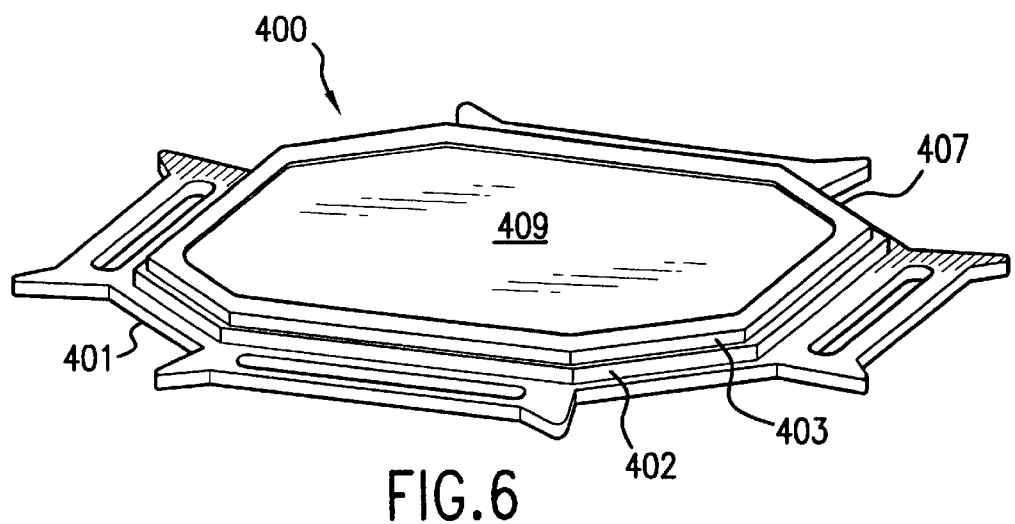
FIG. 6 is an isometric view of another heat spreader design of the present invention.
Figure 7:
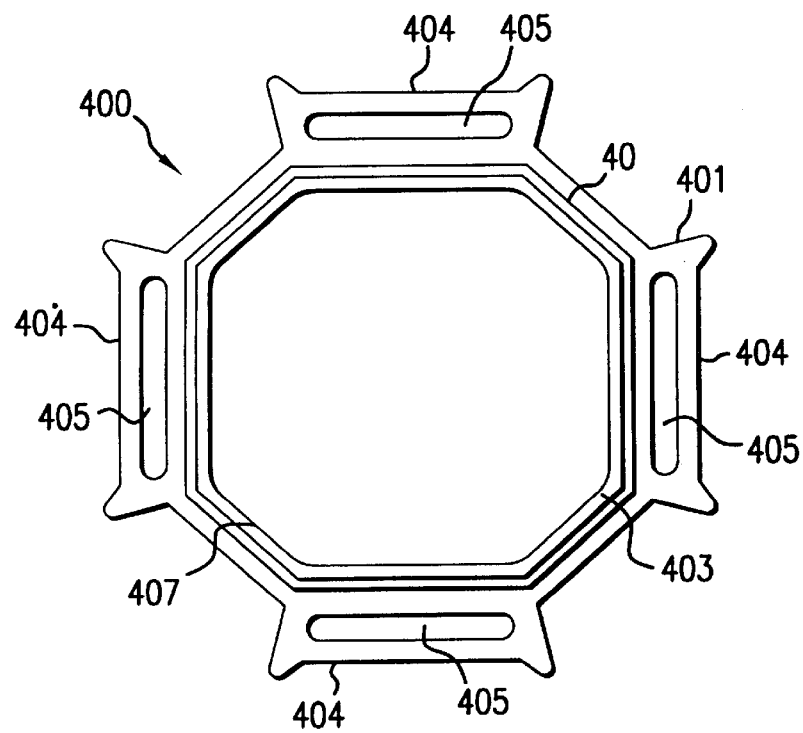
FIG. 7 is a top view of the heat spreader of FIG. 6.
Figure 9:
FIGS. 8 and 9 are side views of the heat spreader of FIG. 6.
Figure 8:
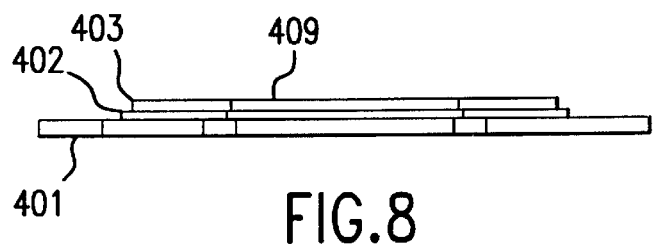

FIGS. 3, 4 and 5 describe another preferred design of a heat spreader of the present invention. Heat spreader 300 has a plurality of fins, e.g., eight fins 301, to help dissipate heat and improve adhesion to the mold compound 101 in FIG. 1. Any number of fins between 2 and 16 or a greater number may be suitable. Each fin 301 has a locking hole 302 to anchor the heat spreader in the package. Heat spreader 300 has two layers 303 and 304. During the encapsulation process, the surfaces of lower layer 303 are surrounded by plastic molding material. The side surface 305 of upper layer 304 is also covered by the plastic molding material. The upper surface 306 of the upper layer 304 is exposed to the atmosphere to allow heat to radiate from the encapsulated package. Upper surface 306, as shown in FIG. 3, has eight equal sides and the distance across the exposed surface (Dimension A) is 16 millimeters. The distance from the edge of the upper surface 307 to the inner intersection of adjacent fins 301 (Dimension B) is 0.62 millimeters. The acceptable range for Dimension B is from 0.50 millimeters to 2.8 millimeters. The preferred value from Dimension B is 0.55–1.1 millimeters. In FIG. 5, the side surface 305 and edge of upper surface 306 of FIG. 4 are enlarged the clearly show the ring seal 307 of the present invention. This enlarged view shows the height of side surface 305 (Dimension C) is 0.43 millimeters and the width of seal ring (Dimension D) is 0.38 millimeters and the height of the seal ring (Dimension E) is 0.03 millimeters. The acceptable range from Dimension C is from 0.15 millimeters to 1.0 millimeter. The preferred value for Dimension C is 0.5 millimeters. Like the first embodiment shown in FIGS. 1–2, this heat spreader is made of anodized aluminum alloy. The preferred aluminum alloys are those designated by the AAI (Aluminum Association, Inc.) in their publication, Aluminum Standards and Data, as 3xxx and 6xxx series. A most preferred aluminum alloy is aluminum alloy 6061, which has a nominal composition of about 0.30 percent by weight copper, about 0.15 percent by weight manganese, and the balance aluminum. The anodization thickness is 0.008 to 0.025 millimeters thick.

FIGS. 6 to 9 show another embodiment of the present invention. In this example, heat spreader 400 has three layers 401, 402 and 403. Lower layer 401 has four pairs of fins 404. Each pair of fins 404 has a locking hole 405 therein. Middle layers 402 is edge step beveled over lower layer 401. Upper layer 403 is edge step beveled over middle layer 402. Upper layer 403 has a perimeter seal ring 407. When used in an encapsulated package, lower layer 401, middle layer 402 and side surface 408 of the top layer 403 will be covered with plastic molding material and only top surface 409 with the seal ring 407 will be exposed to radiate the heat of the package. The width and height dimensions of the seal ring of this embodiment and the other embodiments discussed above, are about 0.5±0.4 millimeters and 0.02±0.014 millimeters, respectively. It is preferred that this heat spreader embodiment also be made of anodized aluminum alloy designated as 3xxx or 6xxx series by the AAI (Aluminum Association, Inc.). A most preferred aluminum alloy is aluminum alloy 6061, which has a nominal composition of about 0.30 percent by weight copper, about 0.15 percent by weight manganese, and the balance aluminum.

While the invention has been described above with reference to specific embodiments thereof, it is apparent that many changes, modifications and variations can be made herein. Accordingly, it is intended to embrace all such changes, modifications and variations that fall within the spirit and broad scope of the appended claims. All patents cited above are incorporated herein by reference in their entirety.

What is claimed is:

1. A metal heat spreader useful in an encapsulated semiconductor package having at least one surface that will be exposed after encapsulation of the package and a raised seal ring around the perimeter of that surface.

2. The heat spreader of claim 1 wherein the metal is aluminum or aluminum alloy.

3. The heat spreader of claim 2 wherein the aluminum heat spreader has an anodized surface.

4. The heat spreader of claim 1 wherein the seal ring has a width of about 0.5±0.4 millimeters and a height of about 0.02±0.14 millimeters.

5. A semiconductor package comprising:
    (a) at least one semiconductor device;
    (b) a heat spreader that has at lease one surface exposed to ambient and the perimeter of that exposed surface having a raised seal ring border;
    (c) a leadframe having a plurality of inner and outer leads, said inner leads interconnected to said semiconductor device; and
    (d) a molding resin encapsulating said semiconductor device, said inner leads of said leadframe and all of the heat spreader except that exposed surface having the seal ring border.

6. The package of claim 5 wherein the metal heat spreader is made of aluminum or aluminum alloy.

7. The package of claim 6 wherein the aluminum heat spreader has an anodized surface.

8. The package of claim 5 wherein the seal ring has a width of about 0.5±0.4 millimeters and a height of about 0.2±0.014 millimeters.

* * * * *

UNITED STATES PATENT AND TRADEMARK OFFICE
CERTIFICATE OF CORRECTION

PATENT NO.    : 6,188,130 B1
DATED         : February 13, 2001
INVENTOR(S)   : German Ramirez and Serafin Padilla Pedron, Jr.

It is certified that error appears in the above-identified patent and that said Letters Patent is hereby corrected as shown below:

<u>Column 4,</u>
Line 9, "0.05" should be -- 0.5 --.

<u>Column 6,</u>
Line 24, change "0.02±0.14" to -- 0.02±0.014 --.
Line 44, change "0.2±0.014" to -- 0.02±0.014 --.

Signed and Sealed this

Thirty-first Day of January, 2006

JON W. DUDAS
*Director of the United States Patent and Trademark Office*